(12) United States Patent
Hutton

(10) Patent No.: US 7,827,433 B1
(45) Date of Patent: Nov. 2, 2010

(54) TIME-MULTIPLEXED ROUTING FOR REDUCING PIPELINING REGISTERS

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 737 days.

(21) Appl. No.: 11/804,157

(22) Filed: May 16, 2007

(51) Int. Cl.
*G06F 5/06* (2006.01)
(52) U.S. Cl. .................. 713/600; 713/320; 713/400; 713/401; 713/500; 713/501; 713/502; 713/503; 367/98; 379/388.03; 379/390.03
(58) Field of Classification Search .................. 713/320, 713/400, 401, 500, 501, 502, 503; 367/98; 379/388.03, 390.03
See application file for complete search history.

(56) References Cited

U.S. PATENT DOCUMENTS

| | | | |
|---|---|---|---|
| 4,972,314 A * | 11/1990 | Getzinger et al. | ........... 711/149 |
| 5,550,782 A | 8/1996 | Cliff et al. | |
| 5,583,450 A | 12/1996 | Trimberger et al. | |
| 5,594,367 A | 1/1997 | Trimberger et al. | |
| 5,629,637 A | 5/1997 | Trimberger et al. | |
| 5,646,545 A | 7/1997 | Trimberger et al. | |
| 5,689,195 A | 11/1997 | Cliff et al. | |
| 5,761,483 A | 6/1998 | Trimberger | |
| 5,825,662 A | 10/1998 | Trimberger | |
| 5,838,954 A | 11/1998 | Trimberger | |
| 5,986,467 A | 11/1999 | Trimberger | |
| 6,107,825 A | 8/2000 | Lane et al. | |
| 6,215,326 B1 | 4/2001 | Jefferson et al. | |
| 6,263,430 B1 | 7/2001 | Trimberger et al. | |
| 6,272,655 B1 | 8/2001 | Hecht et al. | |
| 6,429,681 B1 | 8/2002 | Hutton | |
| 6,480,954 B2 | 11/2002 | Trimberger et al. | |
| 6,617,877 B1 | 9/2003 | Cory et al. | |
| 6,650,141 B2 | 11/2003 | Agrawal et al. | |
| 6,766,505 B1 * | 7/2004 | Rangan et al. | ................. 716/16 |
| 6,823,468 B2 * | 11/2004 | Gredone et al. | ............. 713/600 |
| 6,977,520 B1 | 12/2005 | Hutton et al. | |
| 7,240,233 B2 * | 7/2007 | Gredone et al. | ............. 713/600 |
| 7,245,240 B1 * | 7/2007 | Nguyen et al. | ............... 341/100 |

OTHER PUBLICATIONS

Giovanni De Micheli, Synthesis and Optimization of Digital Circuits, McGraw-Hill, Inc., New York, 1994, Chapter 9, pp. 441-503.
Amit Singh, et al., Interconnect Pipelining in a Throughput-Intensive FPGA Architecture, FPGA 2001, Feb. 11-13, 2001, Monterey, CA, USA, pp. 153-160.
Deshanand Singh, et al., The Case for Registered Routing Switches in Field Programmable Gate Arrays, FPGA 2001, Feb. 11-13, 2001, Monterey, CA, USA, p. 161-169.

* cited by examiner

*Primary Examiner*—Abdelmoniem Elamin
(74) *Attorney, Agent, or Firm*—Ropes & Gray LLP (57) ABSTRACT

Serializing circuitry is provided that can multiplex multiple device output signals and that can drive time-multiplexed data signals on the bus wires of a data path of an electronic system. Bus registers placed at the ends of the bus wires can register or buffer the data signals transmitted over the bus wires. The registered signals may be passed on to deserializing circuitry for demultiplexing the data signals to provide parallel device input signals. The bus registers and the serializing/deserializing circuitry can be provided along signal paths that require additional latency.

23 Claims, 7 Drawing Sheets

TIME-MULTIPLEXED ROUTING FOR REDUCING PIPELINING REGISTERS

BACKGROUND OF THE INVENTION

Programmable logic devices (PLDs) may generally be integrated circuit devices with configurable logic networks linked together by programmable interconnection resources. The configurable logic networks may include device elements such as logic cells (e.g., look-up tables (LUTs) or product term logic), memory cells, and input-output cells. Registers (e.g., D-type flip-flops) may be associated with one or more of the device elements. The registers may hold and transfer data signals (i.e., variables) between the device elements during device operation.

The device elements of a conventional PLD can be often architecturally organized into blocks of programmable logic (e.g., gate array or logic array blocks ("LABs")), blocks of input-output cells, and blocks of memory (e.g., random access memory ("RAM")), etc., for example. Groups of these blocks may make up larger blocks (i.e., "super-regions") that are arranged, for example, in an X-Y array. The programmable interconnection resources of the PLD may be organized as rows and columns of conductors for selectively routing signals to, from, and between the logic, input-output, and memory blocks. See, for example, Cliff et al. U.S. Pat. No. 5,550,782, Cliff et al. U.S. Pat. No. 5,689,195, and Jefferson et al. U.S. Pat. No. 6,215,326, all of which show PLD architectures developed by Altera Corporation of San Jose, Calif.; but other examples of architectures with which the present invention can be used include those developed by other PLD manufacturers such as Xilinx, Inc., also of San Jose, Calif.

Complex logic functions (circuits), as desired, may be implemented in present-day PLDs. The logic functions can be implemented by interconnecting a select configuration of device elements according to a suitable circuit design. Conventional circuit design techniques for synthesis of logic functions may be used to generate a suitable circuit design. The circuit design may be characterized by a corresponding configuration file (i.e., a netlist) that specifies the placement and interconnection of selected device elements. PLDs usually have a large number of device elements that have identical functionality (e.g., AND gates) and that may be used interchangeably. Therefore, several possible circuit designs (i.e., configurations of device elements) may yield the same desired logic function.

The circuit design that is implemented may be optimized for circuit performance. A measure of circuit performance may be data signal propagation delay. This delay may depend, inter alia, on the length of interconnection and on the number of registers between device elements traversed by data signals. A figure of merit of circuit delay performance is the length (e.g., in units of time) of the longest register-to-register delay path ("the critical path") in the circuit. This critical path can also determine the minimum cycle time for a logic step in the PLD device. The reference or master clock signal timing various device elements in the PLD can be set to have a period or cycle that is greater than the minimum cycle time.

The PLD critical path length may be minimized using "re-timing" techniques for optimizing circuit designs. These techniques can address the problem of optimal placement and interconnection of device elements by repositioning registers along the path of data signals. Registers associated with logic cells can be repositioned from the cells' output to input or vice versa, so that the critical path may be as short as possible. Some circuit designs use device elements in different regions. For these designs, repositioning of registers along the data path between the device elements in different regions may not reduce critical path length below the length of a long interconnection that must be used. For example, a PLD cross-chip critical path of about 25 ns may include a long interconnection along which the delay is about 8 ns. Then, the length of the longest interconnection (i.e., 8 ns) sets the smallest time unit or granularity for retiming operations.

Co-owned Hutton U.S. Pat. No. 6,429,681 shows, for example, a way of circumventing the lower bound on time delay due to the longest interconnection length in the data path. The disclosure therein describes the optional insertion of re-timing registers in the interconnections. An inserted re-timing register can effectively fragment the end-to-end interconnection time delay into two smaller time delay units.

Irrespective of the circuit design optimization techniques available or used, most of the chip area in commercially available PLDs and other electronic systems is devoted to programmable interconnection resources. These interconnection resources are responsible for most of the circuit delay. Consideration is now being given to ways of enhancing electronic system architectures to minimize the area devoted to interconnection resources or to reduce the interconnection conductor line count.

SUMMARY OF THE INVENTION

In accordance with the present invention, an electronic device may include a plurality of functional circuitries and signal paths for linking the plurality of functional circuitries, wherein at least one of the signal paths may include serializing circuitry and deserializing circuitry for providing latency to the at least one signal path. For example, a bus wire can provide a programmable signal path from several outputs of a programmable logic block or region to several inputs of another programmable logic block or region. The output signals may be transmitted serially one after another on the bus wire. Multiplexer circuitry may be used to serialize the output signals for transmission over the bus wire. It will be understood that data signals which are transmitted serially may be referred to as "time-multiplexed" data signals herein.

A single bus wire may carry multiple time-multiplexed data signals between the several input/output pairs. A single bus wire may provide the functionality of several interconnection conductors, each of which traditionally connects only a single fixed input/output pair.

"Bus" registers can be associated exclusively with the bus wires. The bus registers placed at the ends of bus wires may be used to register or buffer data signals to and from functional circuitry of the electronic system, such as programmable logic blocks or regions of a PLD. The bus registers may not be associated with any individual device element, such as a logic cell, memory cell, or an input-output cell, and may be in addition to registers that are conventionally associated with individual device elements, for example.

The bus registers may have a configuration similar to that of re-timing registers, such as those disclosed in Hutton U.S. Pat. No. 6,429,681. The bus registers may be placed in parallel to bus wire segmentation buffers. Programmable links associated with the bus registers may enable signal data paths between disconnected bus wires or bus wire segments. The signal data paths may be enabled through the bus registers by bypassing the segmentation buffers using the programmable links.

Other registers may be provided at programmable logic blocks or regions for serializing output data signals from the logic blocks or regions, and for deserializing input data signals received over the bus wires. Serialization and deserialization circuitry may be provided to create latency along certain data paths of the electronic device.

A programmable divider circuit may be provided to generate a register clock signal having a frequency that is a multiple of the PLD chip reference clock signal frequency. Using the register clock signal, the bus, serializing, and deserializing registers may be clocked at a rate faster than the PLD system or reference clock (e.g., "PLD minimum execution cycle"). The registers may be clocked at a suitable rate to schedule the use of a bus wire for transmission of time-multiplexed data signals over the bus wire within a reference clock cycle.

BRIEF DESCRIPTION OF THE DRAWING

The above and other features of the present invention, its nature, and various advantages will become more apparent upon consideration of the following detailed description, taken in conjunction with the accompanying drawings, in which like reference characters refer to like parts throughout, and in which.

DETAILED DESCRIPTION

With respect to FIGS. 1-5, for example, the present invention is described in the context of the programmable logic device architecture disclosed, for example, in Jefferson et al. U.S. Pat. No. 6,215,326. The architecture disclosed in the Jefferson et al. reference is used only for purposes of illustration, with the understanding that the inventive principles of the present invention are applicable to all PLD architectures as well as to any electronic system with data paths that may require additional latency.

The Jefferson et al. reference discloses a PLD architecture which partitions the PLD into a hierarchy of regions. Each region may include programmable circuit blocks (e.g., LAB, input-output cells, memory, etc.). Each of these blocks may have a plurality of inputs and outputs. The inputs and outputs of a circuit block may be connected or wired to the inputs and outputs of other circuit blocks by programmable interconnection conductors. The programmable interconnection resources of the PLD can be organized as rows and columns of conductors for selectively routing signals to, from, and between the logic, input-output, and memory blocks.

The programmable interconnection resources may include conductors of various lengths. Short length conductors may, for example, be used to connect blocks within a region or within neighboring regions. Long length conductors may be used, for example, to provide data signal paths between regions or super-regions across the PLD chip.

In particular, in the Jefferson et al. reference, imaginary vertical and horizontal lines partition the PLD into four quadrants. Long cross-chip horizontal and vertical conductors may be provided for interconnection from one quadrant to another. These long cross-chip conductors can be segmented at the partition boundaries by programmable segmentation buffers. The segmentation buffers may be programmed to allow independent use of either of the half lengths or the full length of a long cross-chip conductor as necessary. The segmentation buffers may be implemented using any suitable switching circuitry. The segmentation buffers may, for example, be implemented using tri-state buffers (see, e.g., FIG. 2, as discussed below) or pass transistors (e.g., CMOS transmission gates).

As partially described in Hutton et al. U.S. Pat. No. 6,977,520, which is hereby incorporated by reference herein in its entirety, and in accordance with the present invention, bus wires can be provided to carry time-multiplexed data signals between the inputs and outputs of programmable blocks or regions. The bus wires may include vertical bus wires, horizontal bus wires, or a combination of both. Bus registers for registering signals driven on the bus wires can be provided at the ends of the bus wires. The bus registers may be exclusively associated with the bus wires. A bus wire may have one or more associated bus registers for optional use. Additional data serializing/deserializing circuitry may be provided at programmable logic blocks or regions for loading and unloading time-multiplexed data signals from the bus wires. Programmable divider circuitry may be provided to generate a register clock signal having a frequency that is a multiple of the PLD chip reference clock signal frequency to drive the time-multiplexed data signals without incurring new latency.

Figure 1A:
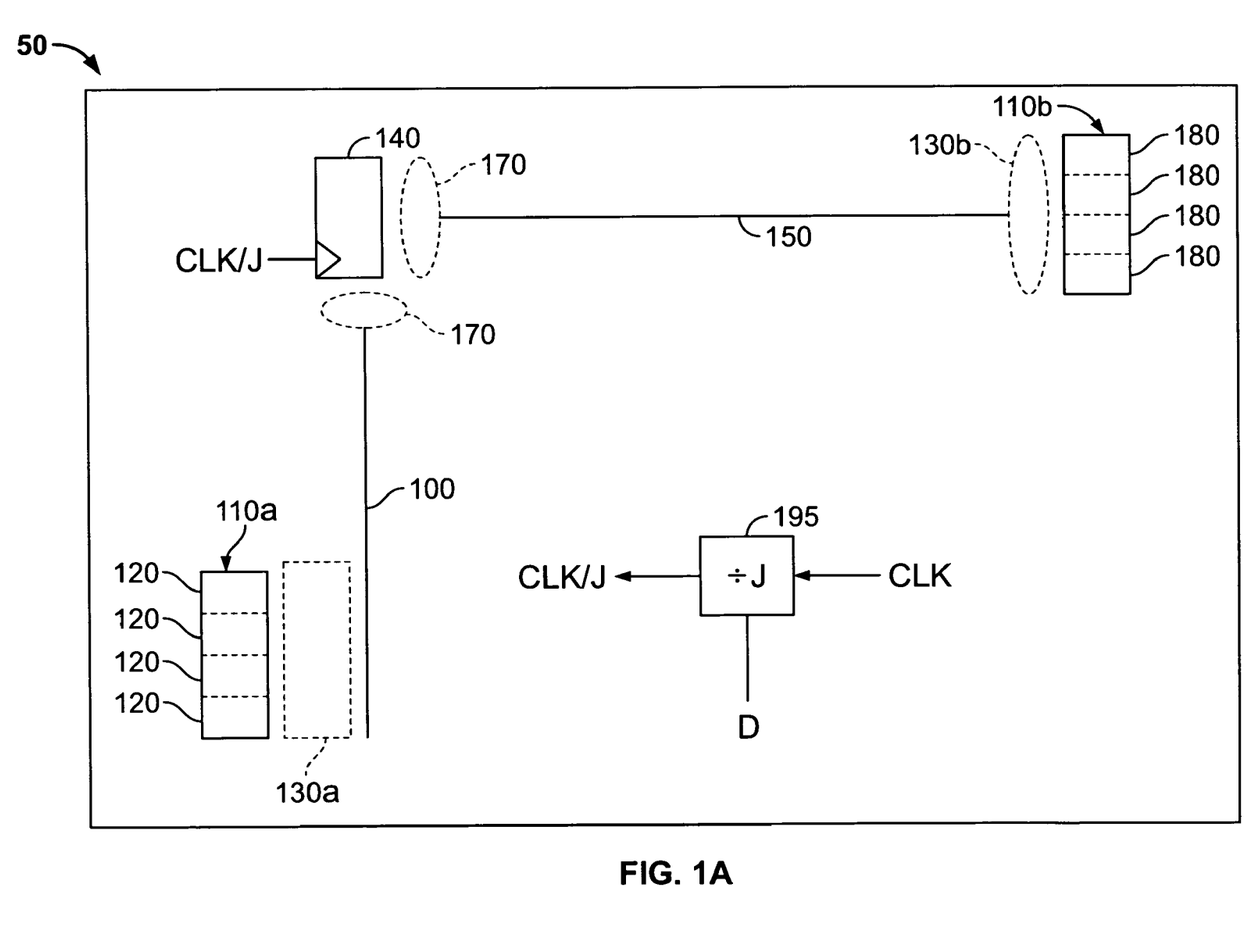
FIG. 1A is a schematic diagram illustrating the provision of registered bus wires capable of transmitting multiple data signals, in accordance with the principles of the present invention.

FIG. 1A, for example, shows PLD 50, that may include vertical bus wire 100 and horizontal bus wire 150 running along programmable logic array blocks (LABs) 110. Only one LAB 110a along vertical bus wire 100, and one LAB 110b along horizontal bus wire 150 are shown. For clarity, other blocks and/or regions along the bus wires are not shown in FIG. 1A. LAB 110a may, for example, have four output flip-flops 120. Also for clarity, other device elements in LAB 110a (e.g., logic control elements (i.e., gates)) that may drive flip-flops 120 are not shown in FIG. 1A. LAB 110a output signals may be placed at any or all of output flip-flops 120. Output flip-flops 120 may be connected to bus wire 100 through bus connecting circuitry 130a.

Figure 1B:
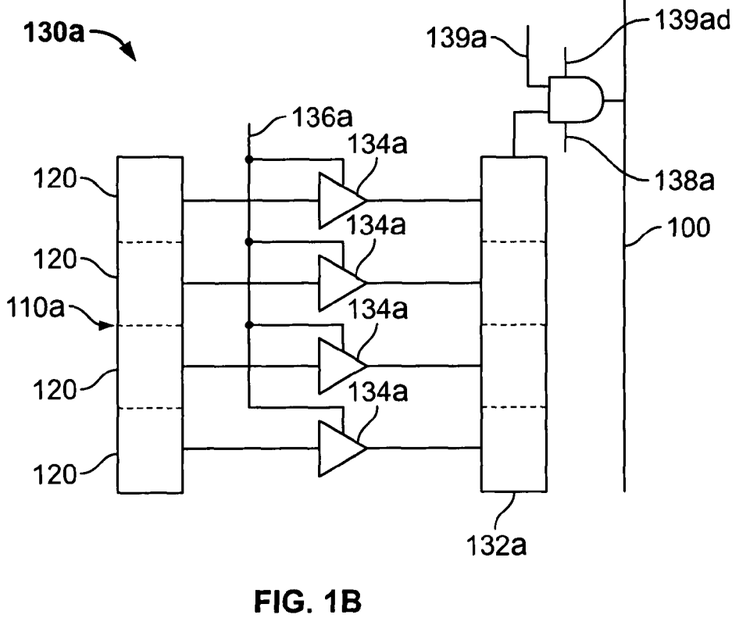
FIG. 1B is a schematic diagram illustrating the provision of serializing circuitry for loading time-multiplexed data signals on a bus wire, in accordance with the principles of the present invention.

As shown in FIG. 1B, for example, bus connecting circuitry 130a may include shift register 132a. Output flip-flops 120 may be connected to shift register 132a, for example, through tristate logic gates 134a. Output data signals stored in flip-flops 120 may be transferred to shift register 132a by activating tristate logic gates 134a by a transfer command signal transmitted over transfer command line 136a. Shift registers associated with one or more LABs along bus wire 100 may be connected to bus wire 100 through conventional tristate logic circuitry. For example, shift register 132a may be connected to bus wire 100 through disconnectable multiplexer (MUX) or gate 138a. Gate 138a may be activated and connected by a transfer command signal transmitted over transfer command line 139a. Alternatively, gate 138a may be disconnected, for example, by a disconnect signal transmitted over disconnect control line 139ad.

Bus register 140 may be located at an end of bus wire 100. Bus register 140 may be connected to bus wire 100, and to other vertical or horizontal bus wires (e.g., horizontal bus wire 150), through suitable programmable interconnection circuitry 170 (see, e.g., FIG. 2). Bus register 140 may be used to register the data signals driven on bus wire 100 by LAB 110a. Bus register 140 may, for example, be a one-bit shift register into which data signal bits can be sequentially loaded and unloaded. Data signals stored in bus register 140 may be serially transmitted to LAB 110b over horizontal bus 150.

Figure 1C:
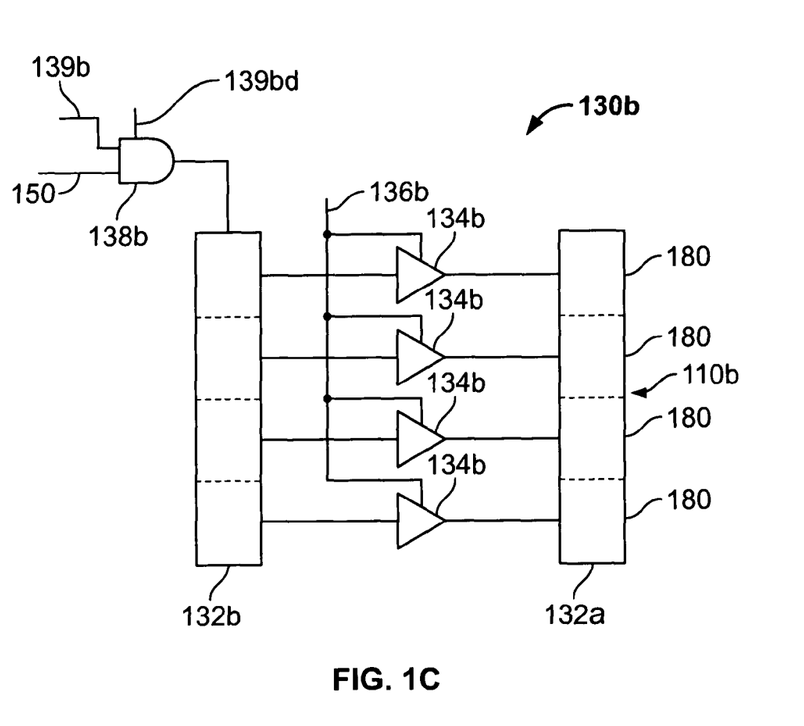
FIG. 1C is a schematic diagram illustrating the provision of deserializing circuitry for unloading time-multiplexed data signals from a bus wire, in accordance with the principles of the present invention.

LAB 110b may receive serial time-multiplexed signals transmitted over bus wire 150 through programmable bus connecting circuitry 130b. Bus connecting circuitry 130b may deserialize the time-multiplexed data signals and may provide parallel inputs to logic cell elements or gates 180 of LAB 110b. With reference to FIG. 1C, bus connecting circuitry 130b may, for example, include shift register 132b. Shift register 132b may be associated with one or more LABs along bus wire 150 and may be connected to bus wire 150 through conventional tristate logic circuitry. For example, shift register 132b may be connected to bus wire 150 through disconnectable gate 138b. Gate 138b may be activated and connected by a transfer command signal transmitted over transfer command line 139b. Alternatively, gate 138b may be disconnected from shift register 132b, for example, by a disconnect signal transmitted over disconnect control line 139bd.

Data signals stored in shift register 132b may be used to drive parallel inputs to one or more gates 180 of LAB 110b. Shift register 132b may be connected to gates 180 of LAB 110b, through, for example, tristate logic gates 134b. Input data signals stored in shift register 132b may be transferred to gates 180 by activating tristate logic gates 134b by a transfer command signal transmitted over transfer command line 136b.

Bus register 140 and shift registers 132 may operate at a clock rate faster than the PLD chip system or reference clock rate. Conventional divider circuitry 195 may be used to divide the chip system clock signal CLK, which may have clock-period clk, by an integer J, and may be used to so generate a faster register clock signal CLK/J. The divider circuitry may be programmable to divide the applied clock signal CLK by any of several selectable values of J, for example, from 1 to 20.

Bus register 140 and shift registers 132 may, for example, be clocked by a register clock signal with a clock-period clk/4, which is one fourth of the system clock-period clk. Clocking the registers at this rate may allow up to four time-multiplexed data signals to be transmitted on a single bus wire connection between LAB 110a and 110b within a single PLD system clock-period clk.

Figure 2:
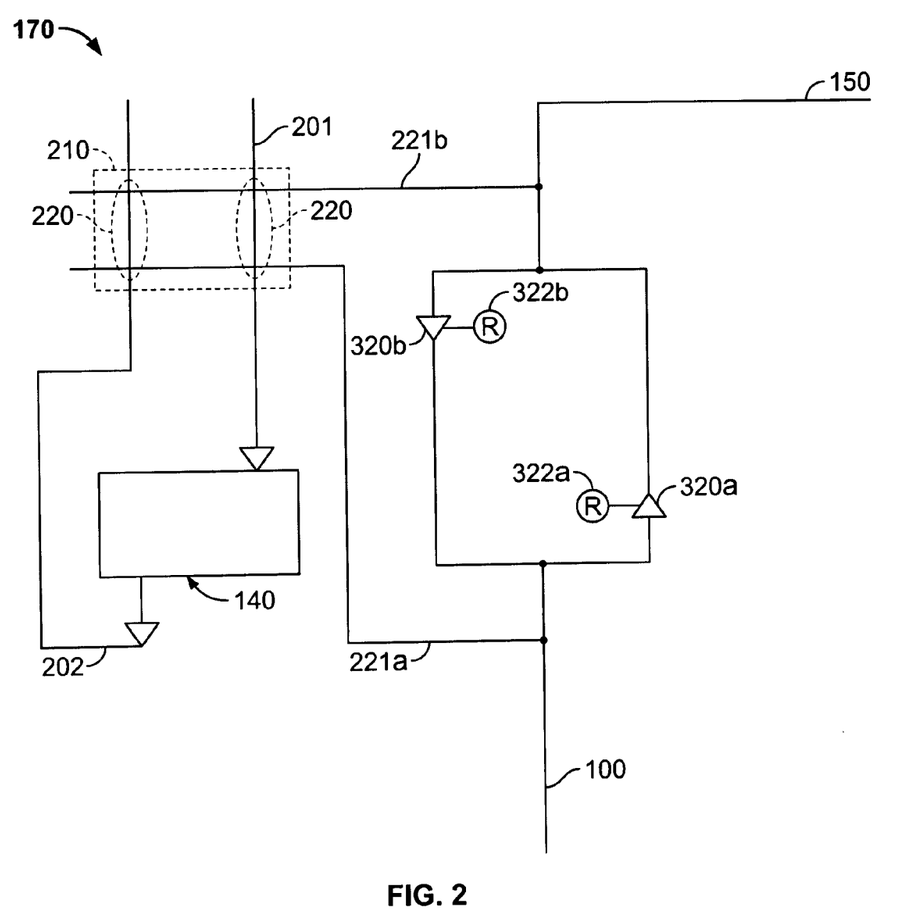
FIG. 2 is a schematic diagram illustrating the provision of a bus register in parallel to segmentation buffers connecting a pair of bus wires, in accordance with the principles of the present invention.

FIG. 2, for example, illustrates an example of programmable interconnection circuitry 170 that may be used to connect bus wires. Bus wires 100 and 150 may be made, for example, of the long cross-chip horizontal and vertical conductors that are provided for interconnection from one PLD quadrant to another, for example, as in Jefferson et al. PLD architectures. Bus wires 100 and 150 may be connected through programmable segmentation buffer 320. Segmentation buffer 320 may be programmed to allow independent use of either bus wire 100 or bus wire 150 as necessary. Segmentation buffer 320 may be implemented using tristate buffers or any suitable switching circuitry (e.g., using CMOS pass transistors). Each segmentation buffer 320 may be controlled by an associated programmable function control element ("FCE") 322a or 322b. FCEs 322 can be programmed to disable both of the associated buffers 320, in which case bus wires 100 and 150 may be used separately and independently. Alternatively, either one of FCEs 322 can be programmed to enable the associated buffer 320, in which case either bus wire 100 drives bus wire 150 or vice versa. For example, if buffer 320a is enabled, bus wire 100 may drive bus wire 150 (as implied in FIG. 1). In this way the two bus wires may be used together.

FIG. 2, for example, also shows bus register 140 associated with bus wires 100 and 150.

Bus register 140 may have an input lead 201 and an output lead 202. Programmable links 210 may selectively connect bus register 140 to the bus wires in parallel with segmentation buffers 320. Links 210 may, for example, be programmable FCE-controlled cross point switches 220 with switch wires 221 leading to the bus wires.

Programmable interconnection circuitry 170 may be optionally programmed by activating segmentation buffer 320 to use bus wires 100 and 150 as a traditional interconnection conductor carrying a single data signal between two PLD blocks. Alternatively, by activating programmable links 210 to connect bus register 140, the bus wires may be used to register and transmit time-multiplexed data signals between the two PLD blocks. The data path may be directed through register 140 with an appropriate input-output orientation using, for example, cross point switches 220. The input-output orientation may be programmed according to whether bus wire 100 is driving bus wire 150 or vice versa. For example, if bus wire 100 is driving bus wire 150, bus wire 100 may be connected to drive register input lead 201 and register output lead 202 may be connected to drive bus wire 150. With these connections, a signal on the driving bus wire 100 can travel over input lead 201 to register 140. Register 140 can register the signal and then pass it over output lead 202 to the driven bus wire 150.

Figure 3:
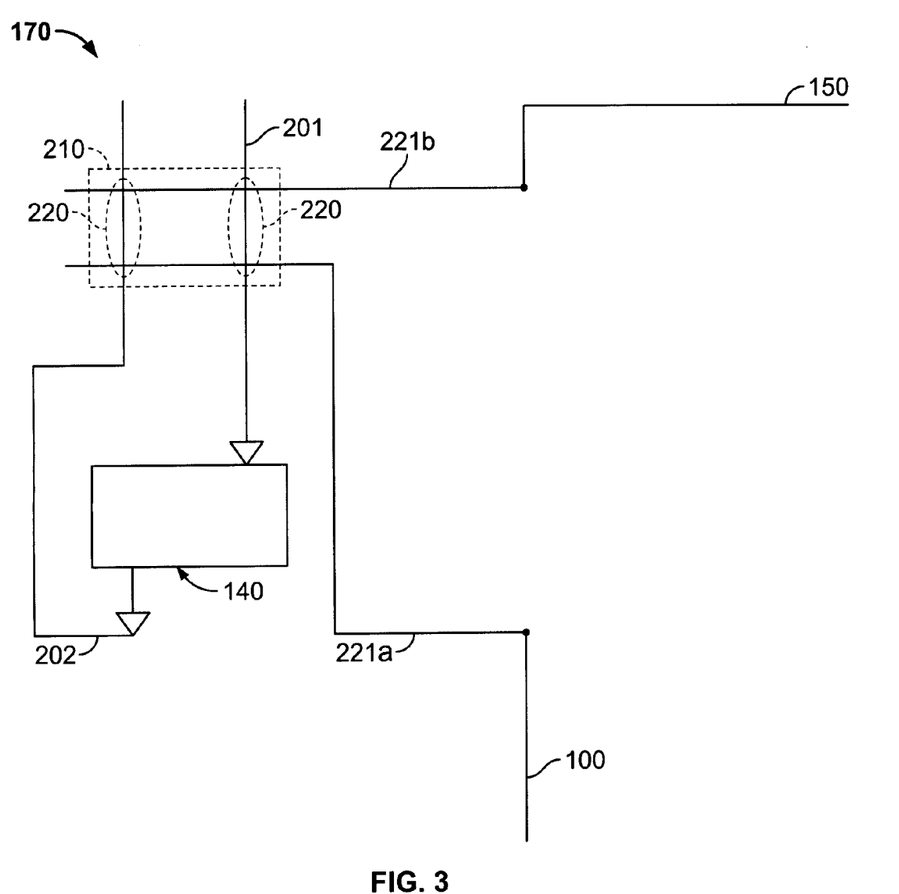
FIG. 3 illustrates a modified PLD architecture corresponding to FIG. 2, with segmentation buffers removed, in accordance with the principles of the present invention.

In PLD designs with a large chip area, long interconnection conductors are usually provided with segmentation buffers. For example, in PLDs using Jefferson et al. PLD architectures, cross-chip interconnection segmentation buffers are provided at hierarchical partition boundaries. Bus wires 100 and 150, for example, may conveniently use the segmentation buffers that are present in pre-existing PLD designs. Other segmentation buffers may be provided as suitable in some PLD circuits. In some PLD circuits long or short bus wires 100 and 150 may be provided without the associated programmable segmentation buffers such as described above, for example. Omitting programmable segmentation buffers associated with bus wires may reduce the costs incurred in providing them. FIG. 3, for example, shows bus wires 100 and 150 in a modified architecture without programmable segmentation buffers 320. Bus wires 100 and 150 may be physically disjoint at their proximal ends, in the absence of buffers 320, as shown. In this modified PLD architecture, data paths between cross-chip device elements may be established using associated bus register 140 to link physically disjoint bus wires 100 and 150. The linking of disjoint segments can occur in the same manner as the linking of bus wires disconnected by disabling buffers 320 as discussed above with reference to FIG. 2.

Figure 4:
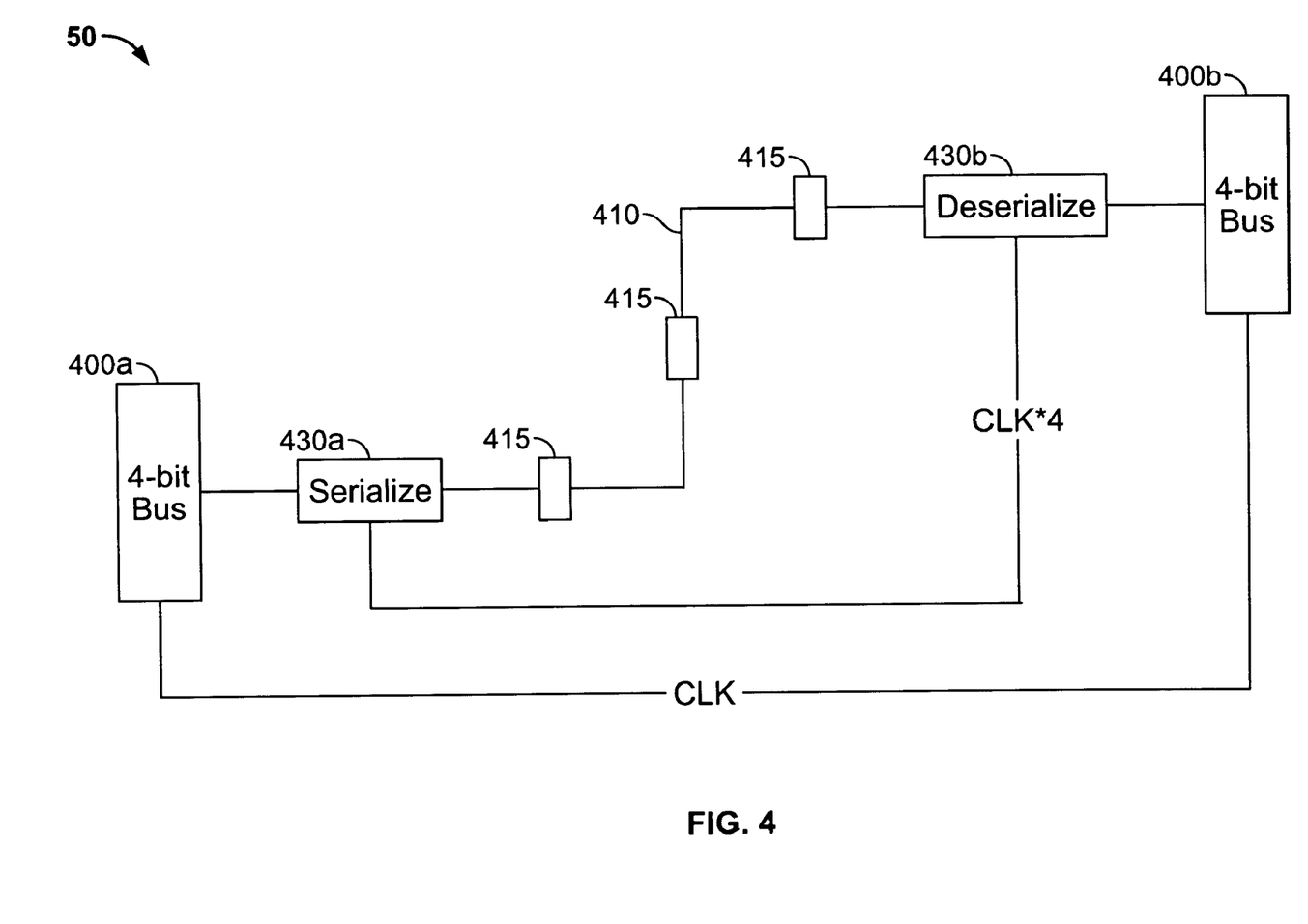
FIG. 4 is a schematic diagram illustrating vertical busses and the data path for transmission of a serialized data signal between adjoining busses, in accordance with the principles of the present invention.

FIGS. 1-3 illustrate PLDs having both vertical and horizontal bus wires. It will be appreciated, as mentioned earlier, that only vertical or horizontal bus wires may be provided in some PLDs. For example, FIG. 4 schematically illustrates a configuration of two vertical busses 400 running vertically across PLD 50. Busses 400 may be clocked by PLD system or clock signal CLK with a clock-period clk. Busses 400 may, for example, be 4-bit busses, which are capable of carrying four data signals in parallel. A signal path 410, which may traverse the PLD in a generally horizontal direction, can link vertical bus 400a to adjoining vertical bus 400b. Signal path 410 may be a 1-bit bus capable of carrying four time-multiplexed data signals serially, for example.

Serializing register circuitry 430a may serialize bus 400a data signals and may drive a serial output signal 415 over path 410. Serializing circuitry 400a may be similar to circuitry 130a of FIGS. 1A and 1B, or may be any other type of serializing circuitry capable of serializing data signals, such as an assortment of shift registers, first-in first-out ("FIFO") memories, or any other suitable technology known in the art, for example. Deserializing register circuitry 430b may deserialize the output signal 415 and may provide inputs to adjoining bus 400b. Deserializing circuitry 400b may be similar to circuitry 130b of FIGS. 1A and 1C, or may be any other type of deserializing circuitry capable of deserializing a data signal known in the art, for example.

Serializing/deserializing circuitry 430 may be clocked, for example, by register clock signal CLK*4 with a clock-period clk/4. By clocking serialization/deserialization circuitry 430 in this manner, four data signals may be time-multiplexed and moved on a 1-bit bus across the PLD chip within a clock period clk (of device reference clock signal CLK), using only one fourth of the traditional interconnection wiring resources required without incurring new latency.

It will also be appreciated by those skilled in the art that commonly used register control signals (e.g., clear, reset, clock, and enable) that are generated by surrounding logic in conventional PLD operation may be appropriately routed and made available for operation by the bus registers and the serializing/deserializing circuitry of the present invention.

The registering of data signals at the ends of bus wires may add a time delay equal to the register clock-period (e.g., clk/J) to the transit time of each subsequent data signal. Adding time delay to signal data paths may seem counter intuitive and contrary to general design goals of minimizing PLD critical path lengths. However, in typical PLD circuit designs the vast majority of data paths are not critical even when the data paths include long interconnection conductors or bus wires. There are many register-to-register paths which are sub-critical and which, even with the addition of a few clk/J delay periods, remain sub-critical paths. The bus registering scheme of the present invention may be most advantageously used for such sub-critical paths to reduce the PLD interconnection line count and the chip area devoted to interconnection resources, as well as pipelining registers used for providing latency (as described below in more detail (see, e.g., FIG. 6)).

The disclosed bus-like structures may be made visible at the top levels of the Computer Aided Design (CAD) hierarchy used to design PLDs. The present invention may be then advantageously implemented in large "systems-on-a-chip" type PLDs. Visibility of the busses at the top levels of the design hierarchy may allow designers to optimally floor plan global interconnect schemes, utilize the bus wires, and register the bus wires at one or both ends.

Additionally or alternatively, the detailed PLD bus wiring scheme or architecture may be made transparent to PLD users through suitable software. For example, the detailed PLD bus wiring scheme or architecture may be provided with a suitable electronic design interface for interfacing with an architecture-independent library of logic functions or modules (i.e., library parameterized modules (LPMs)). Further, the CAD software may be configured to use suitable bus wire LPMs to automatically incorporate time-multiplexed bus wires and synchronized bus registers in a PLD circuit design. Design entry tasks may be simplified by making the bus wiring architecture user-transparent in this manner. For example, on user specification of a few design parameters, such as the desired bus width and throughput, the CAD software may be configured to automatically generate a circuit netlist implementing data signal serialization/deserialization and time-multiplexed scheduling of data signals on bus wires.

In the examples described above and as shown in FIGS. 1-4, for example, bus wires and serializing/deserializing circuitry use 4-bit time-multiplexed signals. It will be appreciated that in accordance with the present invention, bus wires and serializing/deserializing circuitry may be configured to time-multiplex any suitable number of data signals.

The bus and serializing/deserializing registers that are provided in accordance with this invention may generally be dedicated for use in registering and serializing/deserializing bus signals, respectively. The bus and serializing/deserializing registers may therefore be provided in addition to and substantially separate from the other resources, which may include other registers, conventionally provided on a programmable logic device.

Figure 5:
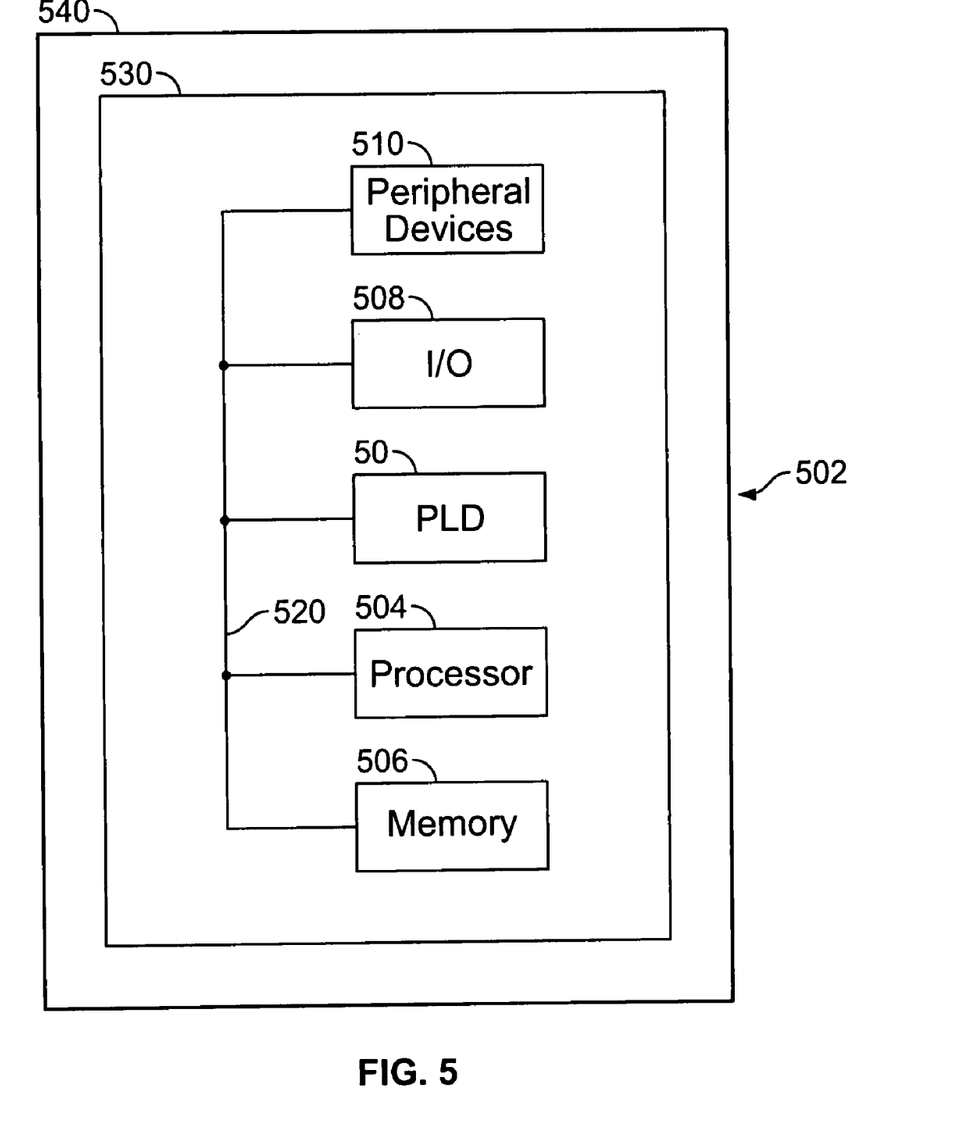
FIG. 5 is a simplified block diagram of an illustrative system employing a programmable logic device, in accordance with the principles of the present invention.

FIG. 5, for example, illustrates a programmable logic device 50 of this invention in a data processing system 502. Data processing system 502 may include one or more of the following components: a processor 504; a memory 506; I/O circuitry 508; and peripheral devices 510. These components may be coupled together by a system bus 520 and may be populated on a circuit board 530 that may be contained in an end-user system 540.

System 502 can be used in a wide variety of applications, such as computer networking, data networking, instrumentation, video processing, digital signal processing, or any other application where the advantage of using programmable or reprogrammable logic may be desirable. Programmable logic device 50 can be used to perform a variety of different logic functions. For example, programmable logic device 50 can be configured as a processor or controller that may work in cooperation with processor 504. Programmable logic device 50 may also be used as an arbiter for arbitrating access to a shared resource in system 502. In yet another example, programmable logic device 50 can be configured as an interface between processor 504 and one of the other components in system 502. It should be noted that system 502 is only exemplary, and that the true scope and spirit of the invention should be indicated by the following claims.

Various technologies can be used to implement the programmable logic devices of this invention, as well as the various components of those devices (e.g., the above-described registers and programmable links). For example, the programmable links can be a relatively simple programmable connector, such as a FCE-controlled switch or a plurality of switches, for connecting any one of several inputs to any one of several outputs, as mentioned above. Alternatively, each programmable link can be a somewhat more complex element that may be capable of performing logic (e.g., by logically combining several of its inputs) as well as making a connection. In the latter case, for example, each programmable link can be product term logic, implementing functions such as AND, NAND, OR, or NOR. Examples of components suitable for implementing programmable links may be, for example, EPROMs, EEPROMs, pass transistors, transmission gates, antifuses, laser fuses, and metal optional links.

As has been mentioned, the components of the programmable links can be controlled by various, programmable, function control elements ("FCEs"). It is to be noted that, with certain programmable link implementations (e.g., fuses and metal optional links), separate FCE devices may not be required. FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above, it will be seen that this invention is applicable to both one-time-only programmable and reprogrammable devices.

Although the present invention has been described above in the context of programmable logic device architecture, one or more bus wires can be provided to carry time-multiplexed data signals between the inputs and outputs of various types of circuitry in any electronic system, such as an Application Specific Standard Product (ASSP), for example, in accordance with the principles of the present invention.

While time-multiplexed routing of signals may be used as described above for reducing the amount of conductor lines needed to transmit those signals, signals may be time-multiplexed for reducing the amount of various other resources needed to execute a particular function. For example, digital signal processing (DSP) circuitry (e.g., a finite-impulse response (FIR) filter) may have time-driven multiplexing inherent in its design for reducing the number of multiplier circuits needed to execute its function. In the computation of a function for an FIR filter, the result of a large number of multiplications may need to be added together to form the end computational result of the filter. If the number of multiplications needed to be executed is larger than the number of multipliers available on the device, at least some of the signals to be multiplied during a particular execution of the filter's function may be time-multiplexed into one or more of the multipliers, thereby re-using one or more of the multipliers.

However, despite effectively reducing the number of multipliers needed, the amount of time (e.g., clock cycles) required for the DSP circuitry block to execute its function may be increased by time-multiplexing some of the signals. Therefore, other portions of a design data path dependant on the output of that DSP circuitry block may too need to incur additional latency to wait for the result of the DSP circuitry block. Conventionally these other portions of a design data path may be provided with simple pipelining registers to create the necessary additional latency or pipeline delay. Yet, according to the principles of the present invention, portions of a design data path requiring additional latency may themselves be provided with time-multiplexing circuitry, not only for providing the necessary latency but also for reducing the amount of conductor lines and registers needed by that design data path.

Figure 6:
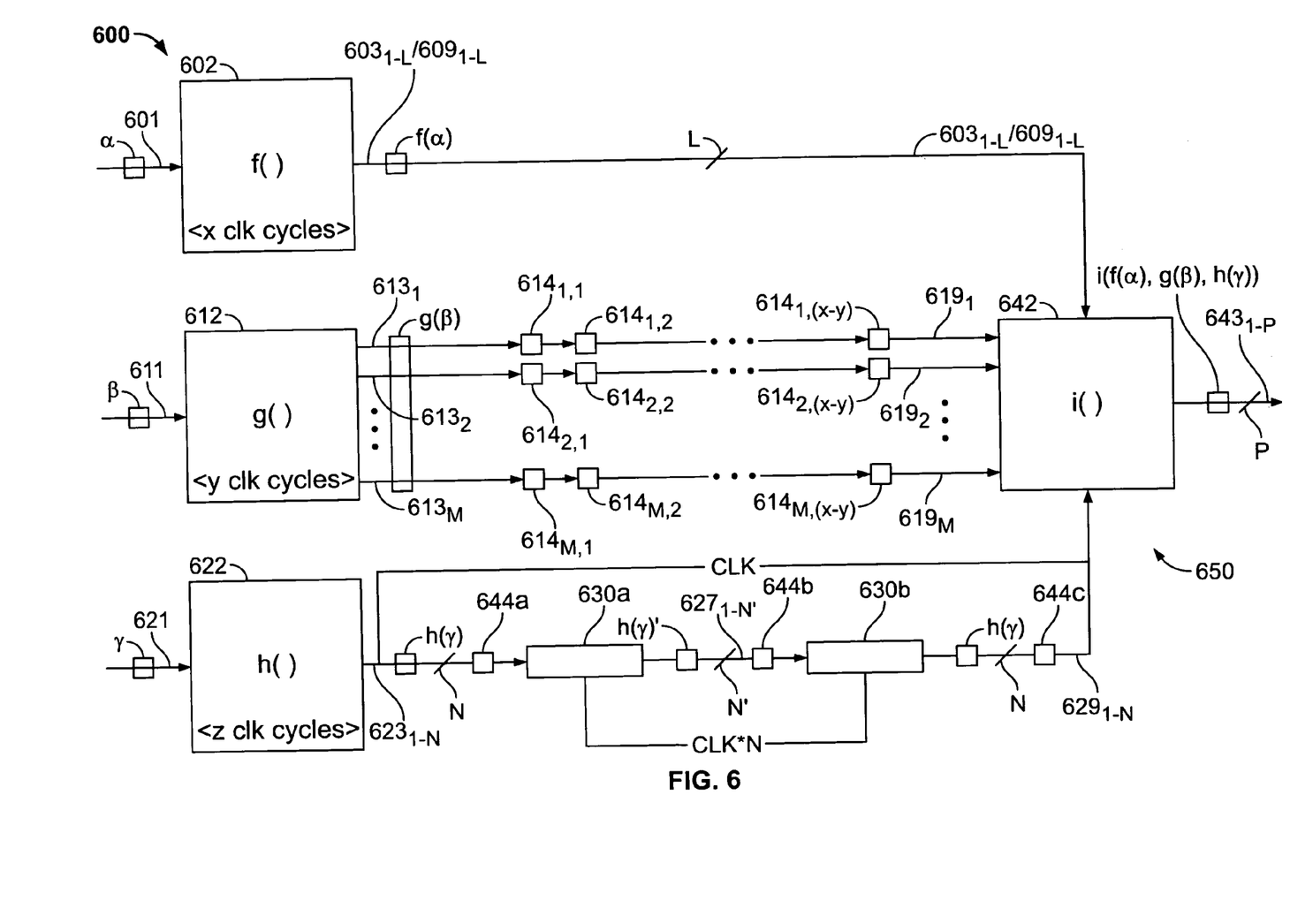
FIG. 6 is a schematic diagram illustrating the provision of an electrical system having serialization and deserialization circuitry for providing latency in a data path in accordance with the principles of the present invention.

FIG. 6, for example, shows electronic system 600 that may include a data path 650. Data path 650 may include functional circuitry 602, functional circuitry 612, functional circuitry 622, and functional circuitry 642. Functional circuitry 602 may perform a function f on an input data signal α provided by input signal path 601 and then drive interim data signal f(α) onto interim input signal path $603_{1-L}$, wherein signal path 603 may be an L-bit bus wire and L may be any integer greater than or equal to one. Functional circuitry 612 may perform a function g on an input data signal β provided by input signal path 611 and then drive interim data signal g(β) onto interim input signal path $613_{1-M}$, wherein signal path 613 may be an M-bit bus wire and M may be any integer greater than or equal to one. Functional circuitry 622 may perform a function h on an input data signal γ provided by input signal path 621 and then drive interim data signal h(γ) onto interim input signal path $623_{1-N}$, wherein signal path 623 may be an N-bit bus wire and N may be any integer greater than or equal to one. While functional circuitry 642 may perform a function i on interim data signals f(α), g(β), and h(γ) respectively provided by interim output signal paths $609_{1-L}$, $619_{1-M}$, and $629_{1-N}$ and then drive output data signal i(f(α), g(β), h(γ)) onto an output signal path $643_{1-P}$, wherein signal path 643 may be a P-bit bus wire and P may be any integer greater than or equal to one.

In some embodiments, electronic system 600 may be a PLD, ASIC, platform PLD, or platform ASIC, for example, and each of functional circuitries 602, 612, 622, and 642 may be one or more logic device elements. In other embodiments, electronic system 600 may be an ASSP or a DSP processor, for example, while each of functional circuitries 602, 612, 622, and 642 may be a memory block or a DSP block or any hard function block, for example.

Data path 650 may require that each of interim data signals f(α), g(β), and h(γ) be provided to functional circuitry 642 in a synchronized relationship such that output data signal i(f(α), g(β), h(γ)) can be a function of properly related values of input data signals α, β, and γ (i.e., such that the input signals occur at the same place in time). Therefore, the amount of time (e.g., clock cycles) that it takes input data signal a to be computed by functional circuitry 602 and then provided on interim output signal path 609 to functional circuitry 642 as interim data signal f(α) should be equal to both the amount of time that it takes input data signal β to be computed by functional circuitry 612 and provided on interim output signal path 619 to functional circuitry 642 as interim data signal g(β) as well as equal to the amount of time that it takes input data signal γ to be computed by functional circuitry 622 and provided on interim output signal path 629 to functional circuitry 642 as interim data signal h(γ).

As described above, certain types of circuitry, such as digital signal processing (DSP) circuitry, may be designed to include time-driven multiplexing for reducing the number of specific circuit elements (e.g., multipliers) needed to execute the circuitry's function while at the same time adding latency thereto. Accordingly, if functional circuitry 602, for example, is such a circuitry provided with time-driven multiplexing that creates latency therein, each of functional circuitries 612 and 622 may need to be provided with additional latency or pipeline delay such that interim data signals f(α), g(β), and h(γ) can be synchronized by the time they are provided to functional circuitry 642.

As an example, and as shown in FIG. 6, functional circuitry 602 may have a latency of X system clock periods (i.e., X*clk) while functional circuitry 612 may have a latency of Y system clock periods (i.e., Y*clk). When X*clk is greater than Y*clk, for example, additional latency or pipeline delay may be provided between functional circuitry 612 and functional circuitry 642. Such additional latency may allow each of interim data signals f(α) and g(β) to be provided to functional circuitry 642 in X system clock periods (disregarding any potential latency provided by interim signal paths 603/609 and/or 613/619), thereby synchronizing those data signals.

One or more shift or pipelining registers 614 may be provided along interim signal path 613/619 for providing one or more stages of latency to interim data signal g(β). For example, if one register 614 provides a latency of one system clock period clk, a number of registers 614 equal in number to the difference between X and Y may be provided along interim signal path 613/619 for providing X minus Y stages of latency to interim data signal g(β). While pipelining registers 614 may ensure that interim data signals f(α) and g(β) are synchronized at functional circuitry 642, not only are M single bit bus wires used, but a number of registers equal to the product of M and the difference between X and Y (i.e., M*(X−Y)) are also required to provide the necessary latency.

As another example, as also shown in FIG. 6, functional circuitry 602 may have a latency of X system clock periods (i.e., X*clk) while functional circuitry 622 may have a latency of Z system clock periods (i.e., Z*clk). When X*clk is greater than Z*clk, for example, additional latency or pipelining delay may be provided between functional circuitry 622 and functional circuitry 642. Such additional latency may allow each of interim data signals f(α) and h(γ) to be provided to functional circuitry 642 in X system clock periods (disregarding any potential latency provided by interim signal paths 603/609 and 623/629), thereby synchronizing those data signals.

In this embodiment, serializing/deserializing circuitry 630 for time-multiplexing data signals, as described above with respect to FIGS. 1-5, for example, may be provided along interim signal path 623/629 for providing latency and pipelining delay to interim data signal h(γ) while also having the capability to require only a fraction of the interconnection wiring resources traditionally used. As shown in FIG. 6, for example, serializing register circuitry 630a, which may be similar to circuitry 130a and/or 430a described above, may serialize interim data signal h(γ) on interim input signal path 623 and may drive a serialized interim data signal h(γ)' over interim time-multiplexed signal path 627. Deserializing register circuitry 630b, which may be similar to circuitry 130b and/or 430b described above, may deserialize serialized interim data signal h(γ)' and drive deserialized interim data signal h(γ) onto interim output signal path 629 for computation by functional circuitry 642.

As described above, functional circuitry 622 may perform a function h on an input data signal γ provided by input signal path 621 and then drive interim data signal h(γ) onto interim input signal path 623$_{1-N}$, wherein signal path 623 may be an N-bit bus wire and N may be any integer greater than or equal to one. Similarly, serializing register circuitry 630a may serialize interim data signal h(γ) on interim input signal path 623$_{1-N}$ and may drive a serialized interim data signal h(γ)' over interim time-multiplexed signal path 627$_{1-N'}$, wherein signal path 627 may be an N'-bit bus wire and N' may be any integer greater than or equal to one. For example, if N is equal to 8 and N' is equal to 2, serializing register circuitry 630a may include two sets of 4 to 1 serialization circuitries each able to serialize signals from 4 distinct bus wires of the 8 bus wires of path 623 onto 1 distinct bus wire of the 2 bus wires of path 627, while deserializing register circuitry 630b may include two sets of 1 to 4 deserialization circuitries each able to deserialize signals from 1 distinct bus wire of the 2 bus wires of path 627 onto 4 distinct bus wires of the 8 bus wires of path 629.

While interim data signal h(γ) may be clocked onto interim signal path 623 and into functional circuitry 642 by electronic system or clock signal CLK with a clock period clk, serializing/deserializing circuitry 630 may be clocked, for example, by register clock signal CLK*N with a clock period clk/N. By clocking serializing/deserializing circuitry 630 in this manner, N-number of data signals may be time-multiplexed and moved across electrical system 600 in data path 650 within a clock period clk using only one-Nth of the traditional interconnection wiring resources required. This may also reduce the latency created by serializing/deserializing circuitry 630. By designing the specific type of circuitry used for serializing/deserializing circuitry 630 and choosing the particular period or periods of the clock signal or signals used to clock the various circuitry elements of circuitry 630, the amount of latency created by circuitry 630 along a signal path can be specifically selected to replace pipelining registers with serializing/deserializing circuitry.

The amount of latency provided to interim data signal h(γ) by the shift registers and/or counters of serialization/deserialization circuitry 630 along interim signal path 623/627/629 may be sufficient to allow each of interim data signals f(α) and h(γ) to be provided to functional circuitry 642 in X system clock periods when X is greater than Z, thereby synchronizing those data signals. However, if the amount of latency provided by serialization/deserialization circuitry 630 is not great enough to synchronize interim data signals f(α) and h(γ), additional shift or pipelining registers 644 may be provided along interim signal path 623 (e.g., one or more shift registers 644a) and/or along interim signal path 627 (e.g., one or more shift registers 644b) and/or along interim signal path 629 (e.g., one or more shift registers 644c). With or without the need for providing additional latency using registers 644, serialization circuitry 630a and deserialization circuitry 630b may reduce the number of pipelining registers used for providing latency (e.g., as compared to the number of pipelining registers 614 used with respect to interim data signal g(β)). Moreover, serialization circuitry 630a and deserialization circuitry 630b may reduce the length and number of interconnection lines and the area devoted to interconnection resources between functional circuitries 622 and 642 in data design path 650 of an electrical system 600.

Therefore, the necessary addition of time delay to signal data paths has been provided using serialization and deserialization circuitry. The bus registering scheme of the present invention may be most advantageously used for a sub-critical data path to reduce the interconnection line count and the area devoted to interconnection resources, as well as to reduce the number of pipelining registers required for providing the needed latency for that data path.

It will be understood that the foregoing is only illustrative of the principles of the invention, and that various modifications can be made by those skilled in the art without departing from the scope and spirit of the invention. For example, the number of device element blocks at each of the various levels in the hierarchy of device element blocks, and the type of the hierarchy itself, can differ from the specific examples mentioned herein. Similarly, the numbers of the various types of interconnection conductors and other elements can deviate from the specific examples mentioned herein. Different types and sizes of logic and memory units and registers can be used if desired.

It will also be understood that various directional and orientational terms, such as "row" and "column," "horizontal" and "vertical," "left" and "right," "top" and "bottom," and the like, are used herein only for convenience, and that no fixed or absolute directional or orientational limitations are intended by the use of these words. For example, the systems and devices of this invention can have any desired orientation. If reoriented, different directional or orientational terms may need to be used in their description, but that will not alter their fundamental nature as within the scope and spirit of this invention. Those skilled in the art will appreciate that the invention can be practiced by other than the described embodiments, which are presented for purposes of illustration rather than of limitation, and the invention is limited only by the claims which follow.

The invention claimed is:

1. An electronic device comprising:
   a plurality of functional circuitries; and signal paths for linking the plurality of functional circuitries, wherein at least one of the signal paths includes serializing circuitry and deserializing circuitry for providing latency to the at least one signal path, wherein the serializing circuitry is configured to multiplex multiple functional circuitry output signals and to drive at least one time-multiplexed data signal on at least one conductor;

wherein the deserializing circuitry is configured to demultiplex the at least one time-multiplexed data signal driven on the at least one conductor into parallel functional circuitry input signals; and wherein the serializing circuitry and the deserializing circuitry are clocked at a higher frequency than the electronic device reference clock frequency for scheduling the transmission of the multiple functional circuitry output signals over the at least one conductor during an electronic device reference clock cycle.

2. The electronic device of claim 1 further comprising divider circuitry for generating a frequency multiple of the electronic device reference clock frequency.

3. A digital processing system comprising: processing circuitry;
a memory coupled to said processing circuitry; and
an electronic device as defined in claim 1 coupled to the processing circuitry and the memory.

4. A printed circuit board on which is mounted an electronic device as defined in claim 1.

5. The printed circuit board of claim 4 further comprising:
a memory mounted on the printed circuit board and coupled to the electronic device.

6. The printed circuit board of claim 4 further comprising:
processing circuitry mounted on the printed circuit board and coupled to the electronic device.

7. An electronic device comprising:
first, second, and third functional circuitries;
one or more first interconnection conductors for providing a first signal path between the first functional circuitry and the third functional circuitry, wherein the first functional circuitry requires a first number of device reference clock cycles to provide a first interim output signal to the third functional circuitry on the first signal path;
a plurality of second interconnection conductors for providing a second signal path between the second functional circuitry and the third functional circuitry, wherein the second functional circuitry requires a second number of device reference clock cycles to provide a second interim output signal to the third functional circuitry on the second signal path; and
time-multiplexed routing circuitry coupled between a first portion of each of the plurality of second interconnection conductors and a second portion of each of the plurality of second interconnection conductors for providing a first latency to the second signal path.

8. The electronic device of claim 7 wherein the first latency is equal to the difference between the first number of device reference clock cycles and the second number of device reference clock cycles.

9. The electronic device of claim 7 wherein the time-multiplexed routing circuitry comprises serializing circuitry that is configured to multiplex a plurality of parallel output signal bits on the first portions of the plurality of second interconnection conductors from the second functional circuitry and to drive at least one time-multiplexed data signal onto at least one time-multiplexed conductor.

10. The electronic device of claim 9 wherein the time-multiplexed routing circuitry further comprises deserializing circuitry that is configured to demultiplex the at least one time-multiplexed data signal driven on the at least one time-multiplexed conductor and to drive a plurality of parallel second interim output signal bits onto the second portions of the plurality of second interconnection conductors.

11. The electronic device of claim 10 wherein the at least one time-multiplexed conductor comprises at least two time-multiplexed conductors.

12. The electronic device of claim 10 wherein at least one of the serializing circuitry and the deserializing circuitry are clocked at a higher frequency than the device reference clock frequency.

13. The electronic device of claim 12 further comprising divider circuitry for generating a frequency multiple of the device reference clock frequency.

14. The electronic device of claim 10 wherein the serializing circuitry provides a first portion of the first latency and the deserializing circuitry provides a second portion of the first latency.

15. The electronic device of claim 14 wherein the first latency is equal to the sum of the first portion of the first latency and the second portion of the first latency.

16. The electronic device of claim 7 further comprising one or more shift registers provided along the second signal path in at least one of the two following positions for providing a second latency to the second signal path: (1) between the second functional circuitry and the time-multiplexed routing circuitry and (2) between the time-multiplexed routing circuitry and the third functional circuitry.

17. The electronic device of claim 16 wherein the sum of the first latency and the second latency is equal to the difference between the first number of device reference clock cycles and the second number of device reference clock cycles.

18. The electronic device of claim 10 further comprising one or more shift registers provided along the second signal path in at least one of the three following positions for providing a second latency to the second signal path: (1) between the second functional circuitry and the time-multiplexed routing circuitry; (2) between the time-multiplexed routing circuitry and the third functional circuitry; and (3) on the at least one time-multiplexed conductor between the serializing circuitry and the deserializing circuitry.

19. The electronic device of claim 18 wherein the sum of the first latency and the second latency is equal to the difference between the first number of device reference clock cycles and the second number of device reference clock cycles.

20. A digital processing system comprising:
processing circuitry;
a memory coupled to said processing circuitry; and
an electronic device as defined in claim 10 coupled to the processing circuitry and the memory.

21. A printed circuit board on which is mounted an electronic device as defined in claim 7.

22. The printed circuit board of claim 21 further comprising:
a memory mounted on the printed circuit board and coupled to the electronic device.

23. The printed circuit board of claim 21 further comprising:
processing circuitry mounted on the printed circuit board and coupled to the electronic device.

* * * * *